United States Patent
Yamanaka et al.

(10) Patent No.: US 8,429,969 B2
(45) Date of Patent: Apr. 30, 2013

(54) INERTIAL SENSOR AND METHOD OF MANUFACTURING THE SAME

(75) Inventors: Kiyoko Yamanaka, Tachikawa (JP); Heewon Jeong, Tokyo (JP); Takashi Hattori, Musashimurayama (JP); Yasushi Goto, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 321 days.

(21) Appl. No.: 12/867,472

(22) PCT Filed: Apr. 17, 2009

(86) PCT No.: PCT/JP2009/057800
§ 371 (c)(1),
(2), (4) Date: Aug. 12, 2010

(87) PCT Pub. No.: WO2010/119573
PCT Pub. Date: Oct. 21, 2010

(65) Prior Publication Data
US 2011/0048129 A1    Mar. 3, 2011

(51) Int. Cl.
*G01P 1/02* (2006.01)
*G01P 15/125* (2006.01)
*G01P 9/04* (2006.01)
*G01C 19/56* (2006.01)

(52) U.S. Cl.
USPC ............ 73/493; 7/514.32; 7/504.12; 7/504.14

(58) Field of Classification Search ............ 73/493, 73/504.12, 504.04, 504.14, 504.16, 504.13, 73/514.32, 514.29, 497, 510, 511
See application file for complete search history.

(56) References Cited

U.S. PATENT DOCUMENTS

| | | | |
|---|---|---|---|
| 7,004,025 | B2 | 2/2006 | Tamura |
| 2002/0051258 | A1 | 5/2002 | Tamura |
| 2005/0166676 | A1* | 8/2005 | Shimizu et al. ............ 73/504.12 |
| 2007/0056370 | A1* | 3/2007 | Braman et al. ............ 73/514.07 |
| 2007/0182289 | A1 | 8/2007 | Kigawa et al. |
| 2008/0136000 | A1 | 6/2008 | Fischer et al. |
| 2008/0211073 | A1 | 9/2008 | Hatakeyama |
| 2009/0183568 | A1* | 7/2009 | Yamanaka et al. ......... 73/504.04 |
| 2010/0025845 | A1* | 2/2010 | Merz et al. .................... 257/723 |

(Continued)

FOREIGN PATENT DOCUMENTS

| | | |
|---|---|---|
| JP | 2000-100984 A | 4/2000 |
| JP | 2002-5950 A | 1/2002 |

(Continued)

OTHER PUBLICATIONS

International Search Report with partial translation dated May 20, 2009 (Four (4) pages).

(Continued)

*Primary Examiner* — Helen C. Kwok
(74) *Attorney, Agent, or Firm* — Crowell & Moring LLP

(57) ABSTRACT

An inertial sensor capable of making pressure of a space in which an inertial sensor such as an acceleration sensor is placed to be higher than that during a sealing step and improving reliability is provided. The inertial sensor can be achieved by means of making an inertial sensor including a substrate, a movable portion on the substrate, a cap member which seals the movable portion so as to cover the movable portion, wherein a gas-generating material is applied to the movable portion side of the cap.

14 Claims, 14 Drawing Sheets

U.S. PATENT DOCUMENTS

2010/0300202 A1*  12/2010  Joyce ................... 73/504.15
2011/0016972 A1*  1/2011   Reinert ................. 73/504.12
2011/0219873 A1*  9/2011   Ohta et al. ............. 73/504.12

FOREIGN PATENT DOCUMENTS

| | | | |
|---|---|---|---|
| JP | 2007-12728 A | | 1/2007 |
| JP | 2007-59736 A | | 3/2007 |
| JP | 2007-214315 A | | 8/2007 |
| JP | 2008-501535 A | | 1/2008 |
| JP | 2008-182103 A | | 8/2008 |
| WO | WO 2007/113325 | * | 10/2007 |

OTHER PUBLICATIONS

PCT/ISA/237 (Three (3) pages), May 20, 2009.

* cited by examiner

DEGASS REACTION AT T1
COMPLETE DECOMPOSITION REACTION AT T2

INERTIAL SENSOR AND METHOD OF MANUFACTURING THE SAME

TECHNICAL FIELD

The present invention relates to a semiconductor physical quantity sensor manufactured by MEMS (Micro Electro Mechanical Systems) technology, and more particularly, it relates to an inertial sensor used for detecting electrostatic capacitance changes.

BACKGROUND ART

Along with development of sensor market and diversification of product types, occasions of recording of ambient environment, and detection of posture of exercise of human body and running condition of vehicles are increasing. Also, along with diversification of scenes of using sensors, occasions of using sensors under traditionally unexpected bad conditions of temperature environment, vibration noise environment, and electromagnetic noise environment are also increasing.

There are various types of sensors having movable structure including, for example, acceleration sensors and angular rate sensors (vibratory gyro) as widely known inertial sensors. In consideration of using two or more types of sensors, a hybrid inertial sensor provided as a package in which an angular rate sensor and an acceleration sensor are integrated has been proposed. For example, in Patent Documents 1 and 2, examples of hybrid inertial sensors in which an angular rate sensor and an acceleration sensor are combined are described. Since an angular rate sensor and an acceleration sensor are provided on the same substrate, a chip of a hybrid inertial sensor can be provided at a low cost, a high alignment accuracy between inertial sensors, and a small space occupancy.

The angular rate sensor includes a vibrating body and a Coriolis element provided inside the vibrating body. Coriolis force is generated when an angular rate is applied while the vibrating body is driven and vibrated at a constant frequency, and the Coriolis element provided inside the vibrating body is shifted in a direction perpendicular to a vibration direction of the vibrating body. By detecting an amount of displacement of the Coriolis element by the Coriolis force, an angular rate can be detected. Here, the faster the speed of the vibrating body in drive control, the larger the Coriolis force. Thus, to improve detection sensitivity of the angular rate sensor, it is necessary to vibrate the vibrating body of the angular rate sensor at a high frequency and large amplitude.

However, a microfabricated vibrating body formed by micromachining technology is largely affected by damping of the air. Since damping is force which is generated in proportion to the speed of the vibrating body, when vibrating the vibrating body in a high-speed state, i.e., in a state at high frequency and large amplitude under a high pressure, influence of damping by the air is increased and it becomes impossible to vibrate the vibrating body at a high frequency and large amplitude. As a result, the angular rate sensor's detection sensitivity is greatly deteriorated. That is, it is preferable to seal the angular rate sensor in an air tight manner at low pressure at which it is difficult to receive viscosity resistance of fluid. By sealing the angular rate sensor in an air tight manner at low pressure, it is possible to reduce influence of damping to the vibrating body. Thus, it is possible to vibrate the vibrating body of the angular rate sensor at a high frequency and large amplitude, and thus the detection sensitivity of angular rate is improved.

However, if the acceleration sensor integrally provided in the package with the angular rate sensor is arranged in the low pressure state, it becomes easier for a movable body of the acceleration sensor to be very prone to vibrate. Normally, when acceleration is not applied to the acceleration sensor, it is preferable for the movable body of the acceleration sensor to be in a resting state. However, when the movable body of the acceleration sensor is arranged in a low-pressure state, viscosity resistance of peripheral fluid cannot be sufficiently received and the movable body is sensitively displaced even by external vibration noise, and thus even when acceleration is not applied, the movable body is displaced. That is, so much sensitive reaction of the movable body of the acceleration sensor is not preferable in view of improving the detection sensitivity of the acceleration sensor.

Accordingly, as an inertial sensor including an angular rate sensor and an acceleration sensor, using configurations and a manufacturing method as described in Patent Documents 1 and 2 is thinkable.

Further, in the air-tight sealing package described in Patent Document 3, laser light is irradiated to a pressure adjusting member inside the package, so that pressure in the package is adjusted.

PRIOR ART DOCUMENTS

Patent Document 1: Japanese Patent Application Laid-Open Publication No. 2002-5950
Patent Document 2: Japanese Patent Application Laid-Open Publication (Translation of PCT Application) No. 2008-501535
Patent Document 3: Japanese Patent Application Laid-Open Publication No. 2008-182103

DISCLOSURE OF THE INVENTION

Problems to be Solved by the Invention

Meanwhile, the inertial sensors described in Patent Documents 1 and 2 are formed through a sealing step of air holes after opening air holes so that a space in which the acceleration sensor is placed is balanced with pressure outside the air hole. It is normal to perform a sealing step of air holes at temperature higher than that of actually using the inertial sensor, and thus the pressure in the space in which the acceleration sensor is placed will not be higher than internal pressure of a manufacturing apparatus of the sealing step of the inertial sensor. Thus, it has been difficult to make the internal pressure of the manufacturing apparatus of the sealing step of the inertial sensor higher than the air pressure, that is, it has been difficult to seal a space in which an acceleration sensor is placed at pressure for obtaining the viscosity resistance effect by peripheral fluid, particularly, higher pressure than the air pressure.

In addition, in the inertial sensors described in Patent Documents 1 and 2, air holes for injecting fluid that is a damping agent into the space in which the acceleration sensor is placed are provided. Even when the air holes are sealed in the manufacturing process, they are sealed in an air tight manner by a cohesion of different materials and thus there is a possibility of fluid leaking in a long term use of the sensor, and so there has been a problem in long-term stability of sensor performance. Also, even when the air holes are completely sealed and there is no leak, there is a possibility of strains occurring in boundary surfaces of different materials due to time degradation or temperature history, and so there has been a problem in reliability of mechanical strength.

Further, in the air-tight sealing package described in Patent Document 3, a window for irradiating razor light is provided and razor light is irradiated, and so there has been a problem of complex additional steps.

A preferred aim of the present invention is to provide an inertial sensor and a method of manufacturing the same capable of make pressure of a space in which an inertial sensor such as acceleration sensor is placed higher than that in a sealing step and improving reliability and productivity.

Means for Solving the Problems

The problem is solved by an inertial sensor including a substrate, a movable portion formed on the substrate, and a cap member which seals the movable portion covering the movable portion, wherein a gas-generating material is applied to the movable portion side of the cap.

In addition, by heating the gas-generating material, it is possible to make the inertial sensor to have the space in which the movable member can be moved at higher pressure than the air pressure.

Further, the inertial sensor may have the pressure in the space being higher than or equal to the air pressure and lower than or equal to 5.1 atm.

Further, the inertial sensor may have the gas-generating material being a tertiary-butoxycarbonyl-oxy carrier.

Further, the inertial sensor may be an inertial sensor including an angular rate sensor and an acceleration sensor being integrated, wherein a movable portion of the angular rate sensor and a movable portion of the acceleration sensor are formed on the same substrate, and a cap member which seals the two movable portions covering the two movable portions is provided, and a gas-generating material is applied only to a portion corresponding to the acceleration sensor of the cap member.

Further, the inertial sensor may have, by heating the gas-generating material, pressure of a first space in which the movable member of the acceleration sensor can be moved being higher than pressure of a second space in which the movable portion of the angular rate sensor can be moved.

Further, the pressure in the first space is higher than or equal to the air pressure and lower than or equal to 5.1 atm.

Further, the inertial sensor may have the gas-generating material being a tertiary-butoxycarbonyl-oxy carrier.

A method of manufacturing an inertial sensor including the steps of: forming a movable portion on a substrate; forming a concave portion of a cap that covers the movable portion; applying a gas-generating material to the concave portion; bonding the cap onto the substrate; and heating the gas-generating material is thinkable.

Further, a method of manufacturing an inertial sensor may include the steps of: forming a first movable portion which measures an angular rate and a second movable portion which measures an acceleration on a substrate; forming concave portions to a cap corresponding to the first movable portion and the second movable portion, the cap covering the first movable portion and the second movable portion; applying a gas-generating material to the second movable portion; bonding the cap onto the substrate; and heating the gas-generating material.

Further, the inertial sensor may be an inertial sensor including two acceleration sensors being integrated, wherein movable portions of the two acceleration sensors are formed on a same substrate, and a cap member which seals movable portions covering the movable portions is provided, and a gas-generating material is applied only to a portion corresponding to one of the two acceleration sensors.

Further, the inertial sensor may have, by heating the gas-generating material, pressure in a first space in which the one of the two acceleration sensors can be moved being higher than pressure in a second space in which the other of the two acceleration sensors.

Further, the inertial sensor may have the pressure in the first space being higher than or equal to the air pressure and lower than or equal to 5.1 atm.

Further, the inertial sensor may have the gas-generating material being a tertiary-butoxycarbonyl-oxy carrier.

Effects of the Invention

It is possible to make a space in which an inertial sensor such as an acceleration sensor at pressure to be higher than that in a sealing step, and an inertial sensor and a method of manufacturing the same capable of improving reliability and productivity can be provided.

BRIEF DESCRIPTIONS OF THE DRAWINGS

BEST MODE FOR CARRYING OUT THE INVENTION

First Embodiment

In a first embodiment, a manufacturing method, a configuration, and effects of forming a hybrid inertial sensor on one chip having: a space in which an angular rate sensor is placed, is sealed at 400 Pa; and a space in which an acceleration sensor is placed is sealed at $2 \times 10^5$ Pa (=2 atm) will be described.

Figure 1:
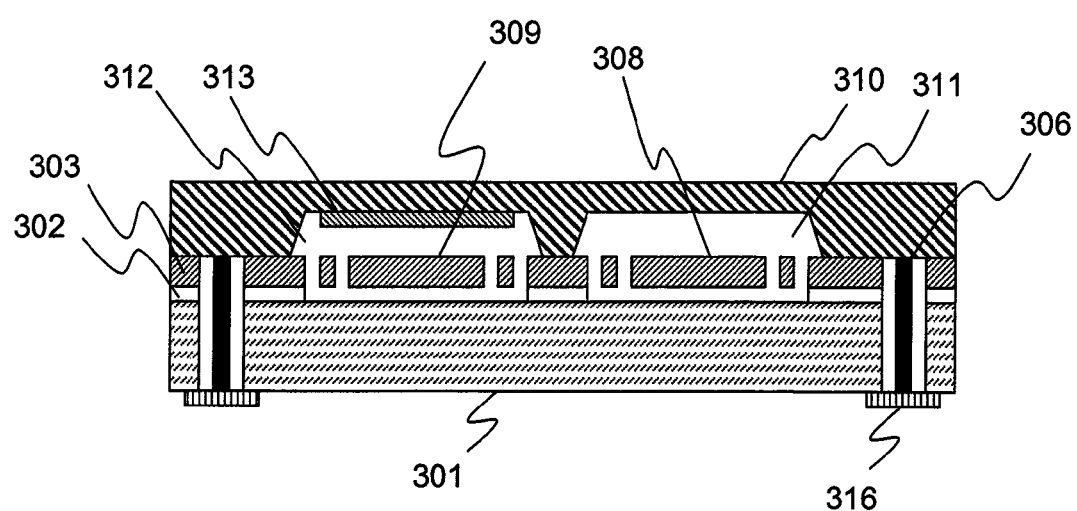
FIG. 1 is a side cross-sectional view of a hybrid inertial sensor to which the present invention is applied.
Figure 2:
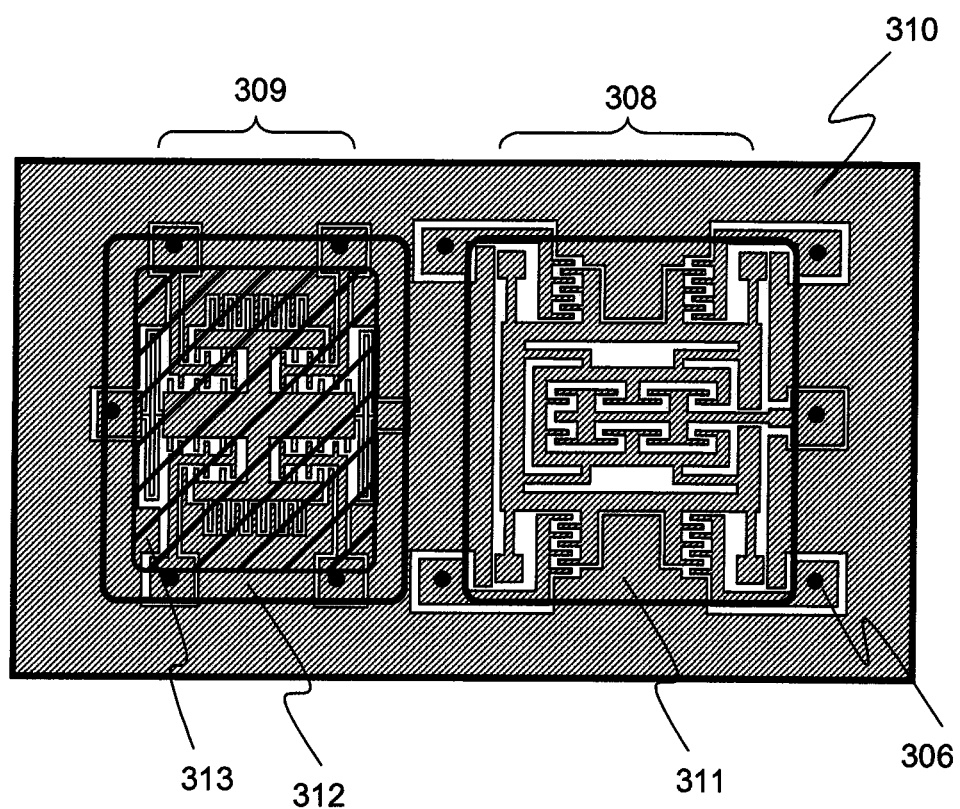
FIG. 2 is a plan view of the hybrid inertial sensor to which the present invention is applied.

(Configuration) FIGS. 1 and 2 illustrate a hybrid inertial sensor including an angular rate sensor and an acceleration sensor to which the present invention is applied using SOI (Silicon On Insulator)-MEMS technology. FIG. 1 is a side cross-sectional view of the hybrid inertial sensor, and FIG. 2 is a plan view. On an SOI substrate formed of a substrate 301 for handling, a buried oxide (Buried Oxide: Box) layer 302, and an SOI layer 303, an angular rate sensor 308, an acceleration sensor 309, and metal wirings 306 of substrate-penetrating type for retrieving electrical signals from a back surface of the chip are formed. A space 311 in which the angular rate sensor is placed and space 312 in which the acceleration sensor is placed are separated by a cap member 310 and each of the spaces is sealed in an air-tight manner. A material 313 which generates gas by applying energy to it is provided inside the space 312 in which the acceleration sensor is placed, and after the air-tight sealing, thermal energy is applied to the gas-generating material 313 to generate gas inside the space in which the acceleration sensor is placed, thereby increasing the pressure inside the space in which the acceleration sensor is placed.

The gas-generating material described here has function of chemically decomposing itself by being applied with thermal energy, making part of reaction product after the decomposition to become gas molecules within a temperature range of intended use of the sensor, thereby increasing peripheral pressure. When using such a gas-generating material which exhibits chemical decomposition reaction, by applying energy, effects different from phase changes of the material such as phase changes between gas and liquid and between gas and solid and physical reactions such as adsorption and dissociation of the gas molecules to a solid surface can be obtained. That is, it is possible to make the pressure inside the space higher than initial pressure or increase the pressure inside the space to pressure breaking thermally-equilibrated state of the gas molecules inside the space. Herein, the generated gas molecules are preferable to be inert gas which does not physically and chemically react with material in the periphery. Also, the pressure inside the space is preferable to be higher than or equal to the air pressure and lower than or equal to 5.1 atm.

Figure 3:
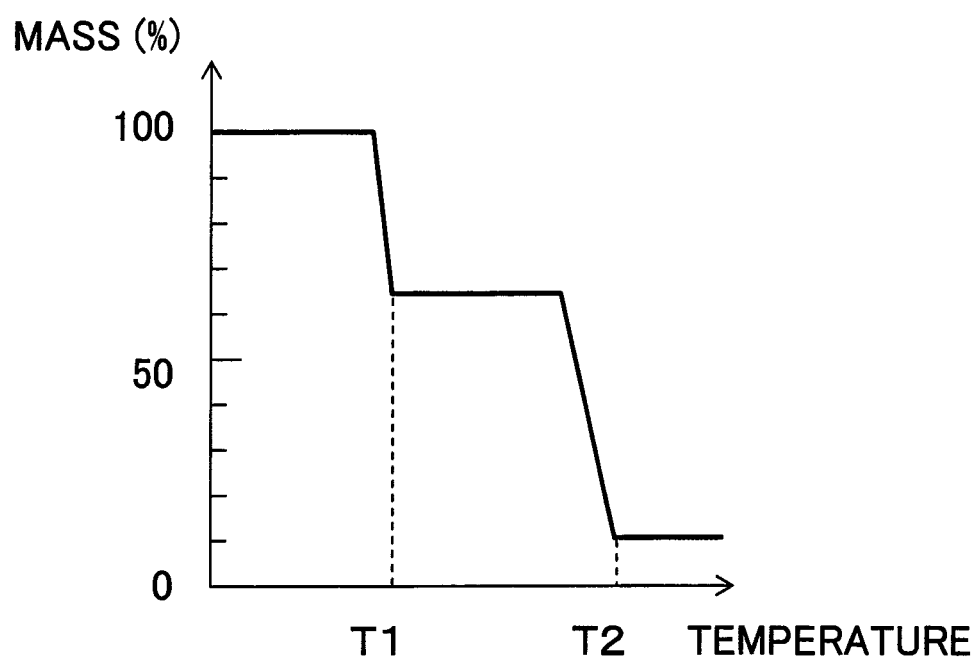
FIG. 3 is a graph illustrating changes in composition mass by heating of a gas-generating material.
Figure 4:
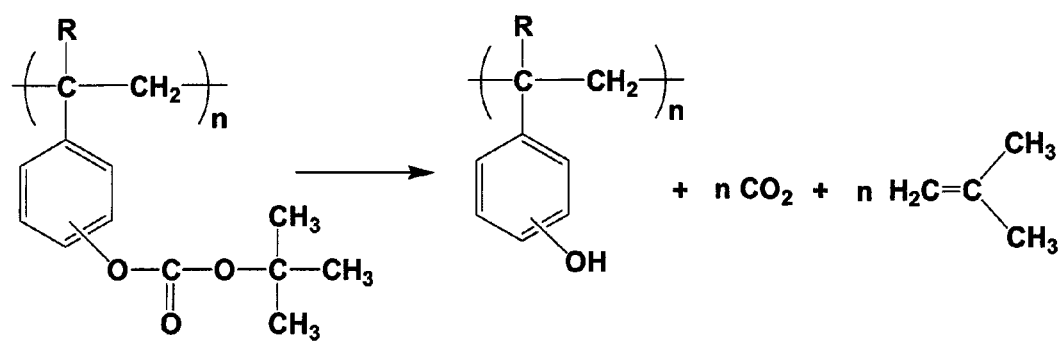
FIG. 4 is a thermal decomposition reaction diagram of a tBOC carrier of the gas-generating material.

An example of using a tertiary-butoxycarbonyl-oxy (tBOC) carrier which is, for example, a monomer material of a heat developing resist as the gas-generating material of the present invention will be described. When gradually heating this material from the room temperature, a thermal decomposition reaction at a first stage is generated at temperature T1 as illustrated in FIG. 3 as a tBOC thermal decomposition curve. A tBOC chemical equation is, as illustrated in FIG. 4, a reaction of decomposing the tBOC carrier into a resin, carbon dioxide, and low-molecular-weight alkene. The thermal decomposition reaction generated at T1 is an irreversible decomposition reaction and decomposition reactions are generated in almost all composing molecules when the temperature exceeds T1. While the temperature T1 is adjustable by a modification of the tBOC carrier, it is about 150 to 300° C. When the material is heated to higher than T1, a second stage thermal decomposition reaction is generated at temperature T2 as illustrated in FIG. 3. This is a thermal decomposition reaction of the resin which is a reaction product of the thermally decomposed tBOC carrier, and, while the temperature T2 is adjustable by a modification of the tBOC carrier, it is about 400° C. or higher. Thus, in the hybrid inertial sensor including the angular rate sensor and the acceleration sensor, when the tBOC carrier is provided as the gas-generating material only inside the space in which the acceleration sensor is placed and the whole of the sensor is heated at temperature higher than or equal to T1 and lower than or equal to T2 after sealing in an air-tight manner, it is possible to produce carbon dioxide only inside the space in which the acceleration sensor is placed. Since the number of molecules of carbon dioxide produced after reaction is proportional to the molar quantity of the chemical equation illustrated in FIG. 4, it is possible to adjust pressure in the space in which the acceleration sensor is placed after heating by adjusting the amount of providing the gas-generating material.

Note that, when using the tBOC carrier which is a monomer material of a heat developing resist, energy to be applied to the gas-generating material is thermal energy, and, by heating the whole of the sensor after a manufacturing step of sealing the spaces in which the angular rate sensor and the acceleration sensor are placed, the pressure inside the space in which the acceleration sensor is placed can be increased.

(Manufacturing Method) Next, a method of manufacturing the hybrid inertial sensor to which the present invention is applied will be described with reference to FIGS. 5A to 7C.

Figure 5A:
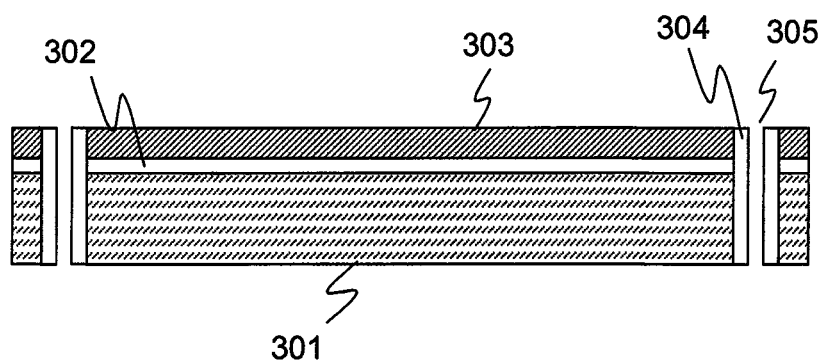
FIGS. 5A-5C are manufacturing process flow diagrams of the hybrid inertial sensor including an inner-pressure-adjusting gas-generating material to which the present invention is applied.
Figure 5B:
Figure 5C:
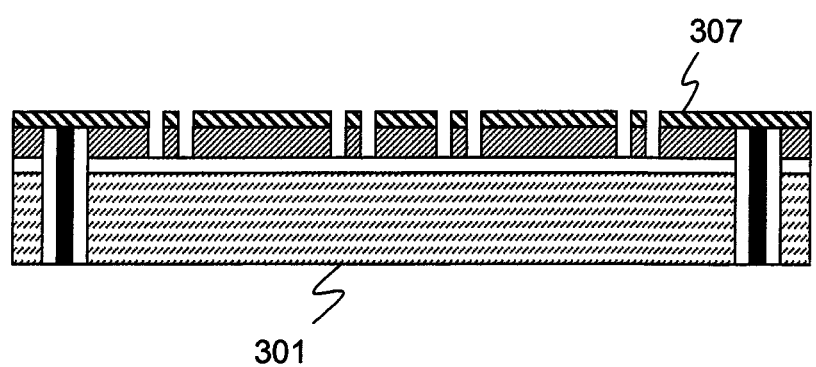

(Substrate and Cap Processing) First, on the SOI substrate formed of: the substrate 301; the BOX oxide 302; and the SOI active layer 303, wafer through-holes 305 are formed by deep etching technology of single crystal silicon from both sides of a surface and a back surface (FIG. 5A), and a metal material is buried after electrically protecting a surface of the processed hole by an insulator, and metal wirings 306 of substrate through type for retrieving electric signals from the back surface of the chip are formed (FIG. 5B). Thereafter, a photoresist 307 is formed to the SOI active layer 303 and an inertial body structure of the sensor is transferred by photolithography technology, so that structure is formed to the SOI active layer 303 by deep etching technology of single crystal silicon (FIG. 5C).

Figure 6A:
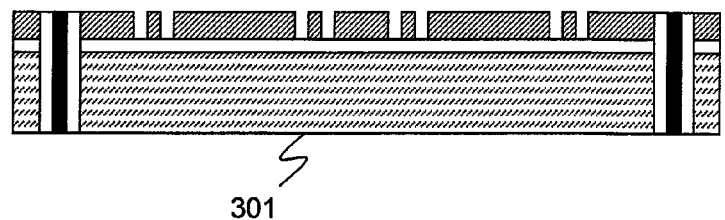
FIGS. 6A-6C are manufacturing process flow diagrams of the hybrid inertial sensor including the inner-pressure-adjusting gas-generating material to which the present invention is applied.
Figure 6B:
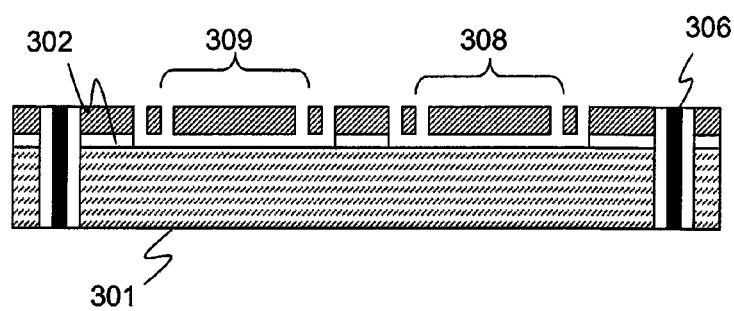
Figure 6C:
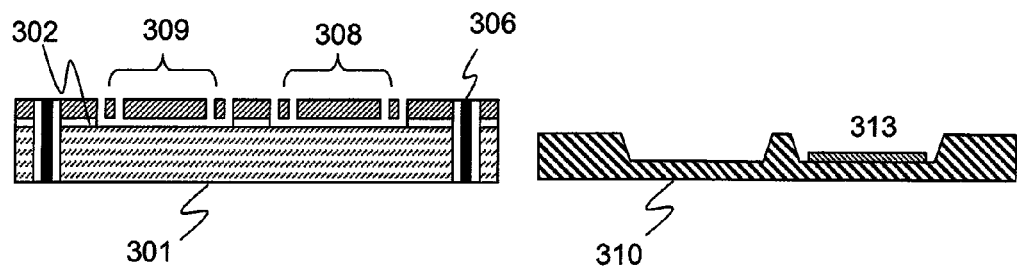

The applied photoresist 307 is removed by ashing (FIG. 6A), and further, the BOX oxide 302 at a lower portion of the structure is removed by etching, thereby obtaining the substrate 301 to which the movable structures of the angular rate sensor and the acceleration sensor are formed (FIG. 6B). On the other hand, to the cap member 310 formed of glass, single crystal silicon, or a resin, a space for placing the angular rate sensor and space for placing the acceleration sensor are formed by using a chemical or physical etching method. After the space for placing the acceleration sensor, the gas-generating material 313 is attached to a place corresponding to the space for placing the acceleration sensor of the cap member 310 by a falling-drop method (instillation method) or spin coating (FIG. 6C).

(Amount of Providing Material) Herein, the amount of attaching the gas-generating material 313 is determined in the following manner. When an area the acceleration sensor occupies on the chip is 1.0 mm×1.0 mm, a spatial depth of the cap member 310 is 100 μm, and a thickness of the BOX oxide 302 forming a space at a lower portion of the sensor is 2.0 μm, a volume V of the space in which the acceleration sensor is placed is about $1.0 \times 10^{-10}$ m$^3$. Sealing is performed so that pressure of the space in which the angular rate sensor is placed is 400 Pa at temperature 300K (near the room temperature), and thus initial pressure $P_0$ of the space in which the acceleration sensor is placed is also 400 Pa at temperature 300K (near the room temperature) before a heating pressure adjustment of the gas-generating material. Thus, a molecular weight $n_0$ of gas previously existing in the space in which the acceleration sensor is placed can be expressed as, with using the gas constant R (=8.31×10³ Pa·m/K/mol) and according to the equation of state of ideal gas, $$n_0 = P_0 V/(RT) = 1.6 \times 10^{-14} \text{[mol]} \quad (1).$$

Further, when target pressure $P_1$ of the space in which the acceleration sensor is placed is $2.0 \times 10^5$ Pa (2 atm), a required molar quantity $\Delta n$ of the generated gas can be calculated from Equations (2) and (3) according to Charles's law of ideal gas and is expressed as $$n_0/P_0 = (n_0 + \Delta n)/P_1 \quad (2)$$

$$\Delta n = (P_1/P_0 - 1)n_0 = (P_1/P_0 - 1)(P_0 V/(RT)) = 8.0 \times 10^{-12} \text{[mol]} \quad (3).$$

Figure 8:
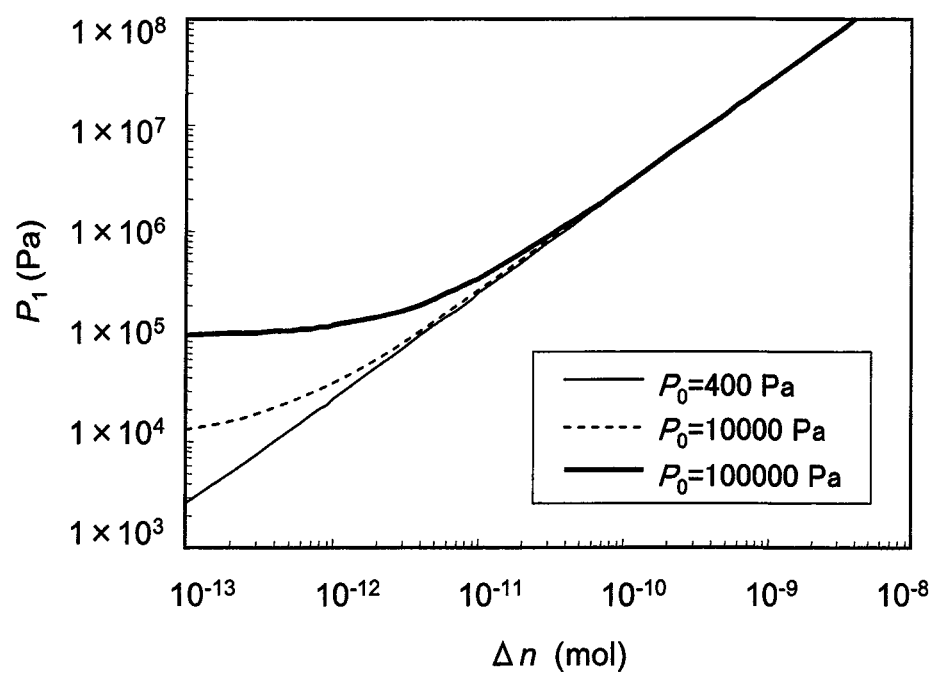
FIG. 8 is a graph illustrating a relation of target pressure of space and molar quantity of the gas-generating material.

Since the thermal decomposition reaction of the tBOC carrier follows the reaction equation illustrated in FIG. 4 in a stoicheiometric view, it can be interpreted that 1 mol of carbon dioxide is generated with respect to 1 mol of the tBOC carrier having a macromolecular chain of n=1. That is, the molar quantity of the tBOC carrier which is the gas-generating material is equal to the molar quantity $\Delta n$ of the generated carbon dioxide. Note that, when the initial pressure $P_0$ is set to the three kinds of 400 Pa, $1.0 \times 10^4$ Pa, and $1.0 \times 10^5$ Pa, the target pressure $P_1$ of the tBOC carrier of the space in which the acceleration sensor is placed formed in the present embodiment and the molar quantity $\Delta n$ of the tBOC carrier required to achieve the target pressure $P_1$ have a relation described in the graph of FIG. 8, and the target pressure $P_1$ can be freely set by changing $\Delta n$.

(Required Molar Quantity of tBOC Carrier) The gas-generating material containing the tBOC carrier of $\Delta n = 8.0 \times 10^{-12}$ [mol] required to make the target pressure $P_1$ at $2.0 \times 10^5$ Pa (2 atm) is obtained in the following manner. As a solvent of butyl acetate having a specific gravity of 0.88, a solution of the tBOC carrier having a molar concentration of 1% is made. When the butyl acetate solution of the tBOC carrier having a molar concentration of 1% is provided to a region in which the acceleration sensor is placed (area: 1 mm×1 mm) of the cap member having a thickness of 200 nm, a mole number of the tBOC carrier contained in the solution is $8.0 \times 10^{-12}$ [mol], and a molar quantity of carbon dioxide obtained by subjecting the solution to a heating decomposition is $8.0 \times 10^{-12}$ [mol]. Note that, when using a solution of the tBOC carrier with using butyl acetate as a solvent, it is possible to stably attach the tBOC carrier to the cap member, the tBOC carrier becoming a film membrane state when a prebaking is performed at a boiling point of the butyl acetate (126° C.) or more after applying the solution to the cap member by falling-drop method or spin coating.

Figure 7A:
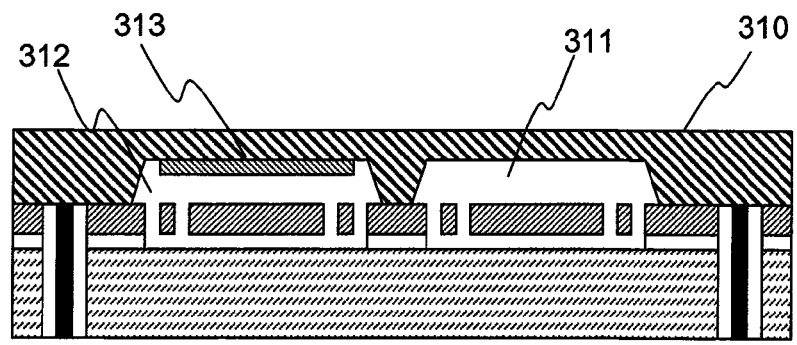
FIGS. 7A-7C are manufacturing process flow diagrams of the hybrid inertial sensor including the inner-pressure-adjusting gas-generating material to which the present invention is applied.
Figure 7B:
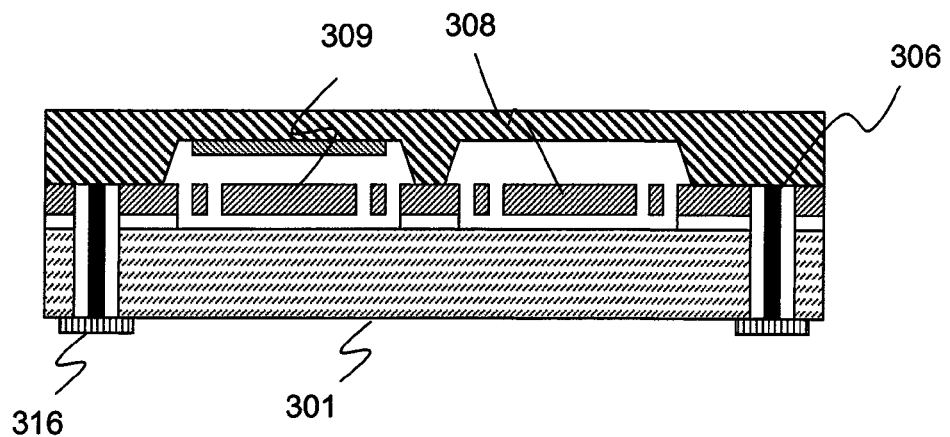

(Bonding and Back Surface Wiring) Next, the substrate 301, to which the movable structures of the angular rate sensor 308 and the acceleration sensor 309 are formed, and the cap member 310, in which the gas-generating material is attached to the space in which the acceleration sensor is placed, are bonded at pressure lower than or equal to 400 Pa at which detection accuracy of the angular rate sensor can be sufficiently obtained. Both of the space in which the angular rate sensor is placed and the space in which the acceleration sensor is placed are sealed in an air-tight manner not to cause pressure changes upon performing an exchange of gas molecules through the outside of the sensor chip. A method of bonding is a method of using an adhesive when the cap member is a resin, or an anode bonding method when the cap member is single crystal silicon or glass. With predicting degassed components from an interface of the materials upon bonding, the sealing is performed at pressure lower than the target pressure. Right after the bonding sealing, pressures of the space 311 in which the angular rate sensor is placed and the space 312 in which the acceleration sensor is placed are the same (FIG. 7A). After that, pads 316 for wire bonding for connecting to the metal wirings 306 of substrate through type are formed for retrieving electrical signals from the back surface of the chip (FIG. 7B).

Figure 7C:
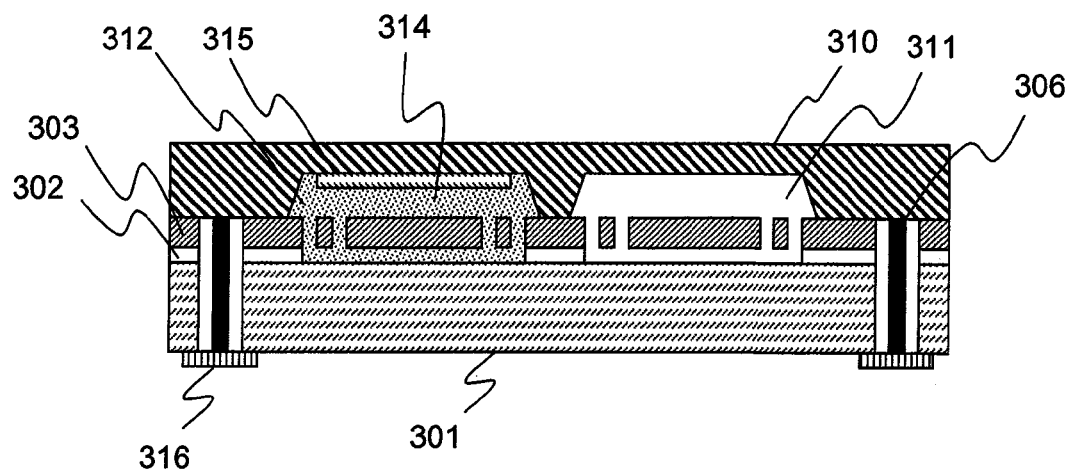

(Pressure Adjusting Procedure) After bonding the cap member and the substrate, the whole of the sensor is heated. Heating temperature in this step may be higher or equal to temperature causing the gas-generating material 313 to exhibit the first stage thermal decomposition reaction and lower than or equal to temperature causing the second stage thermal decomposition reaction. More specifically, when the gas-generating material is the tBOC carrier which is a monomer material of a thermal development type resist, the thermal decomposition reaction temperature T1 of the first stage is about 150° C. to 250° C., and the thermal decomposition reaction temperature T2 of the second stage is about 400° C. or more, and thus the temperature to heat the whole of the sensor may be set to 150° C. to 400° C. After the thermal decomposition reaction of the gas-generating material, residual substance 315 and carbon oxide molecule 314 exist in the space 312 in which the acceleration sensor is placed (FIG. 7C). The boiling point of carbon oxide is −78.5° C./1 atm, and thus, the pressure of the space 312 in which the acceleration sensor is placed can be higher just by partial pressure of molecules of the generated carbon oxide at temperature higher than −78.5° C. Since the gas-generating material does not exist in the space in which the angular sensor is placed, there is nothing other than degassing reaction from a material surface of a wall of the space in which the angular rate sensor is placed. That is, the pressure of the space in which the angular rate sensor is placed is rarely fluctuated by heating the whole of the sensor.

In this manner, by adding the step of heating after the air-tight sealing step of the sensor, the inside of the space 312 in which the acceleration sensor is placed and the gas-generating material is provided can be sealed in an air tight manner at pressure higher than that of the space 311 in which the angular rate sensor is placed. In this case, the hybrid inertial sensor can be sealed in a configuration having no air holes for injecting a damping agent, and thus an acceleration sensor or a hybrid inertial sensor ensuring a long-term stability of a mechanical strength and sensor performance and is difficult to be affected by vibration noise can be obtained.

Note that the difficulties of being affected by vibration noise of the acceleration sensor put under pressure of 400 Pa and an acceleration sensor put at $2.0 \times 10^5$ Pa (2 atm) can be specifically calculated in the following manner.

The air viscosity resistance effect in a MEMS device can be approximately formulated by enhancing the Navier-Stokes equation and a continuity equation which is a classic analysis method of continuous fluid. In the present embodiment, a main cause of receiving the air viscosity resistance effect is a protrusion structure which a comb-teeth type detecting electrode being adjunct to the sensor inertial body has, and an air viscosity resistance coefficient C is expressed as:

$$C = 96 \eta_{eff} L W^3 / (\pi^4 g^3) \quad (4)$$

$$\eta_{eff} = \eta/(1 + 9.638 K_n^{1.159}) \quad (5)$$

$$K_n = \lambda/L_c = k_B T/((\sqrt{2})\pi d^2 \text{gas} P L_c) \quad (6).$$

Note that l is a length of the protrusion structure, w is a width of the protrusion structure, g is a distance (gap) between protrusion structures, $\eta_{eff}$ is an effective value of viscosity of peripheral gas, $\eta$ is a viscosity constant of peripheral gas, $K_n$ is the Knudsen number, λ is a mean free path of the peripheral gas, L is a representative length of a flow field and also a length corresponding to the distance between the protrusion structures, $k_B$ is the Boltzmann constant, T is absolute temperature, $d_{gas}$ is a diameter of a molecule of the peripheral gas, and P is pressure of the peripheral gas. Thus, when acceleration sensors having totally the same structure are put under two pressures of 400 Pa and $2.0 \times 10^5$ Pa (2 atm), a value of the air viscosity resistance coefficient C is 102 times larger than that in the equation (4) in the acceleration sensor put under $2.0 \times 10^5$ Pa (2 atm) than that of the acceleration sensor put under 400 Pa.

Figure 9:
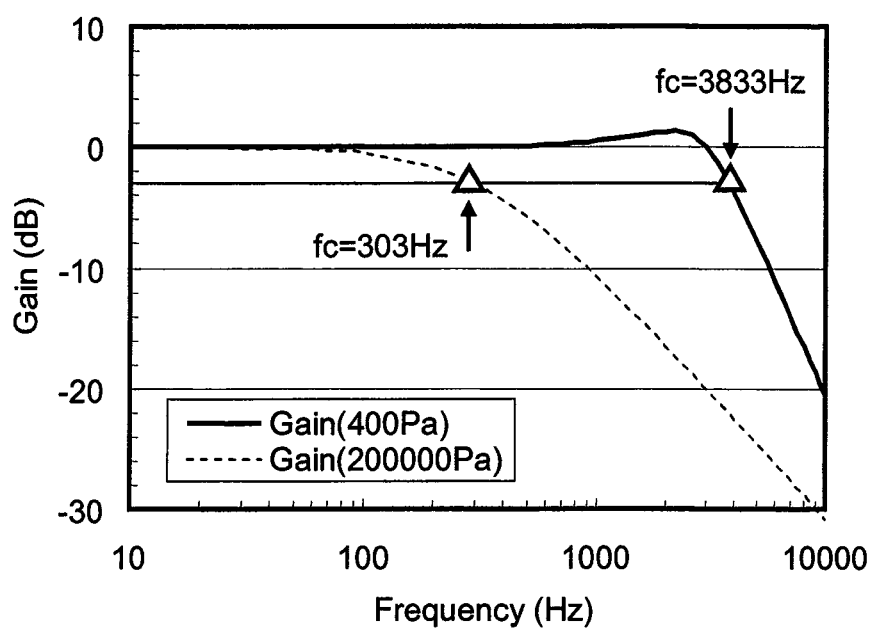
FIG. 9 is a graph illustrating frequency characteristics of an acceleration sensor put under pressure at 400 Pa and an acceleration sensor put under pressure at $2.0 \times 10^5$ Pa.

In addition, a relation among a Q value of the MEMS device, a damping constant ξ, and a mechanical cutoff frequency fc can be expressed as $$Q=1/(2\xi)=\sqrt{(mk)}/C \tag{7}$$

$$(f_c/f_0)^2=-(\xi-1)+\sqrt{((\xi-1)^2+1)} \tag{8}$$

when m is an inertial mass of the sensor and k is a rigidity constant in a main axis direction of the inertial body. When the damping constant under $2.0 \times 10^5$ Pa (2 atm) is 50, frequency characteristics of the acceleration sensor put under $2.0 \times 10^5$ Pa (2 atm) can be expressed as FIG. 9, and the cutoff frequency fc and the Q value are expressed as in Table 1.

TABLE 1

Characteristics Comparison of Acceleration Sensors

| Pressure of Space P | $2.0 \times 10^5$ Pa | 400 Pa |
|---|---|---|
| Character Frequency f0 | 3000 Hz | |
| Cutoff Frequency fc | 303 Hz | 3832 Hz |
| Q Value | 0.01 | 1.02 |

According to Table 1, the acceleration sensor provided at $2.0 \times 10^5$ Pa (2 atm) is a mechanical filter having a cutoff frequency fc of 303 Hz. Thus, as compared with the acceleration sensor provided at 400 Pa having a mechanical cutoff frequency fc of 3832 Hz, filtering properties being difficult to be affected by high-frequency vibrational noise is obtained. While a method of removing signals in a frequency band higher than a frequency to be measured by an electrical signal processing is thinkable, there is a possibility of erroneous output by the sensor if the sensor inertial body is operated in a range exceeding a mechanically allowable range, and thus the sensor inertial body is essentially preferable to be difficult to receive operational affection by vibrational noise.

Note that, while the space in which the acceleration sensor is placed has been set at $2.0 \times 10^5$ Pa (2 atm) in the embodiment, the internal pressure of the space is adjustable in a range in which carbon dioxide which is generated gas is not liquefied in a temperature range (−30 to 80° C. in normal use and −40 to 125° C. in in-vehicle use) in which the inertial sensor is used. Taking the triple point in the phase diagram of carbon dioxide (−56.6° C., $5.2 \times 10^5$ Pa) as a guide, an upper limit value of the pressure after an adjustment is preferable to be about $5.2 \times 10^5$ Pa (5.1 atm).

Also, while a configuration and a manufacturing method of a hybrid inertial sensor including an angular rate sensor and an acceleration sensor, the hybrid inertial sensor having air holes for balancing pressure between a space in which the acceleration sensor is placed and the outside of the sensor mediated by gas have been described in the embodiment, even when the present invention is applied to a hybrid inertial sensor including an angular rate sensor and an acceleration sensor, the hybrid inertial sensor having air holes for balancing pressure between a space in which the angular rate sensor is placed and the outside of the sensor mediated by gas and gas-generating material is provided in a sealed space in which the acceleration sensor is placed, there is the effect of obtaining an inertial sensor being difficult to be affected by vibrational noise.

Note that, while the configuration and the manufacturing method of the hybrid inertial sensor including the angular rate sensor and the acceleration sensor have been described in the embodiment, there is the effect of obtaining an inertial sensor being difficult to be affected by vibrational noise even when the present invention is applied to a single acceleration sensor.

Second Embodiment

In a second embodiment, a manufacturing method, configuration, and effects of obtaining an acceleration sensor being difficult to be affected by vibrational noise by forming two acceleration sensors on the same chip and sealing them in spaces at different pressures of 5000 Pa and $3.0 \times 10^5$ Pa, respectively, will be described step-by-step.

Figure 10:
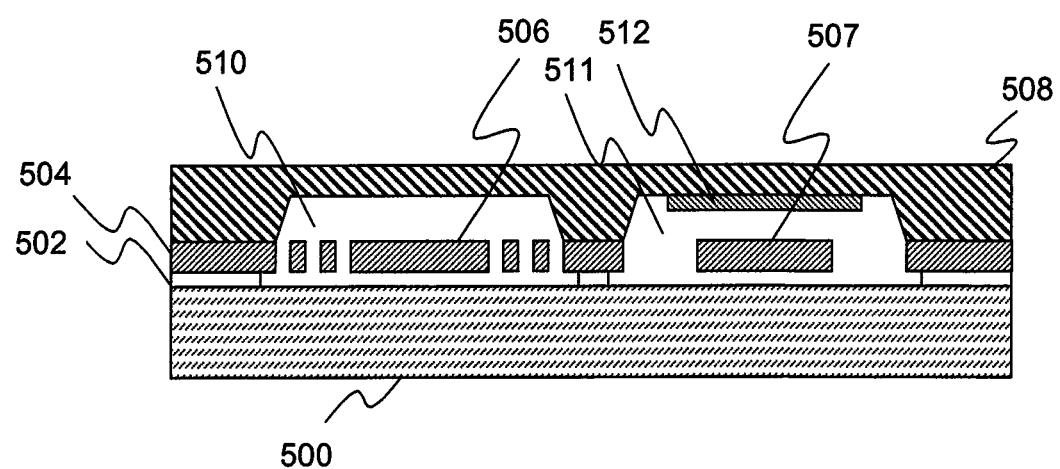
FIG. 10 is a side cross-sectional view of a hybrid inertial sensor to which the present invention is applied.
Figure 11:
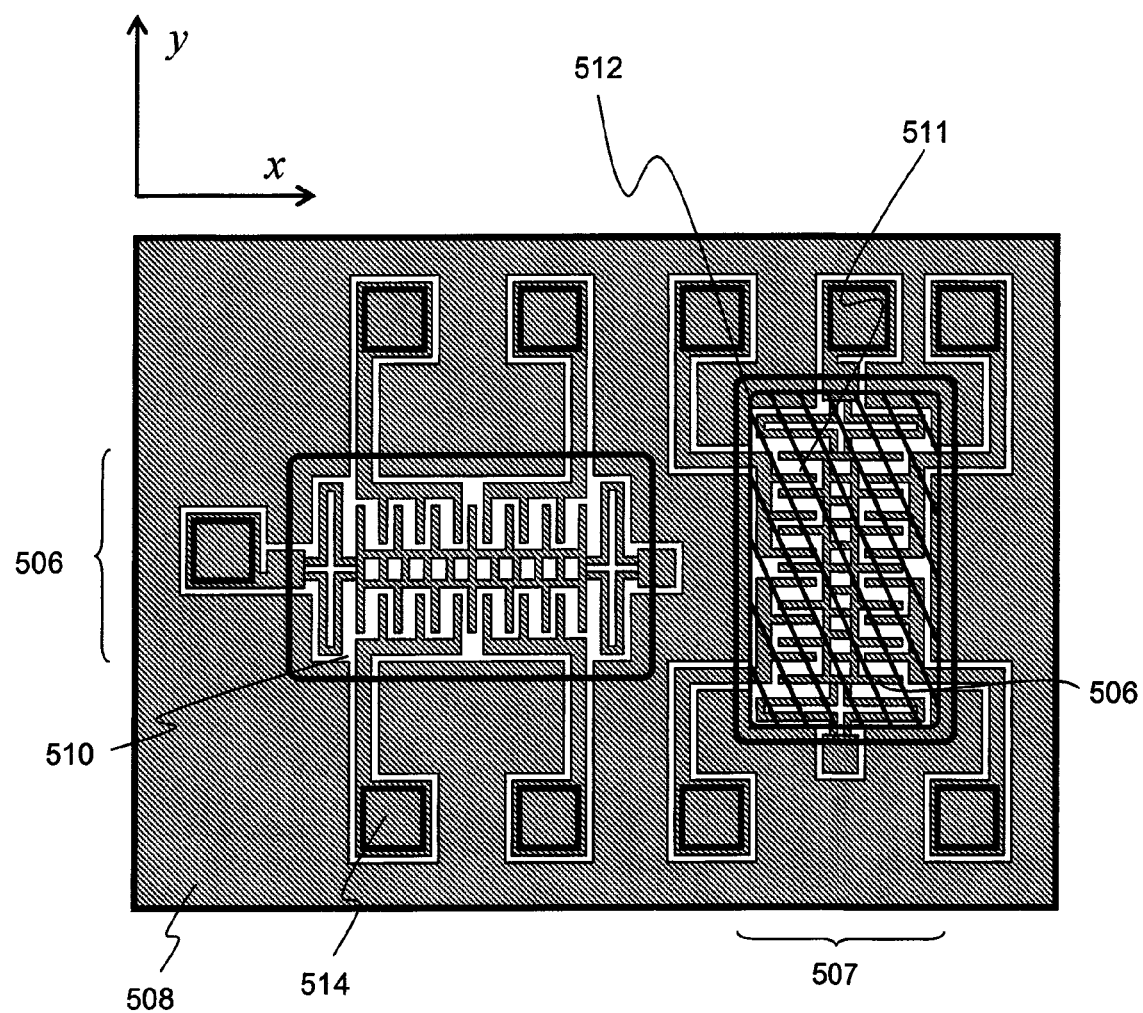
FIG. 11 is a plan view of the hybrid inertial sensor to which the present invention is applied.

(Configuration) FIGS. 10 and 11 illustrate a configuration of a hybrid inertial sensor including two acceleration sensors using SOI-MEMS technology. FIG. 10 is a side cross-sectional view of the hybrid inertial sensor, and FIG. 11 is a plan view of the same. On an SOI substrate including a substrate 500 for handling, a BOX oxide 502, and an SOI layer 504, an x-axis acceleration sensor 506 is formed. Herein, an acceleration sensor (y-axis acceleration sensor 507) having the same structure is arranged at an angle of 90 degrees to each other on the substrate. A space 510 in which an acceleration sensor (hereinafter, called an x-axis acceleration sensor) having a detection axis in the x-axis direction in FIG. 11 is placed and a space 511 in which an acceleration sensor (hereinafter, called an y-axis acceleration sensor) having the y-axis direction and a detection axis in FIG. 11 is placed are separated by a cap member 508, and each of them is sealed in an air-tight manner. A gas-generating material 512 is provided to the space 511 in which the y-axis acceleration sensor is placed by applying energy, and after the air-tight sealing, thermal energy is applied to the gas-generating material 512 to generate gas inside the space 511, thereby increasing pressure inside the space in which the y-axis acceleration sensor is placed.

The gas-generating material described here has function of chemically decomposing itself by being applied with thermal energy, making part of reaction product after the decomposition to become gas molecules in a temperature range of intended use of the sensor, thereby increasing peripheral pressure. When using such a gas-generating material which exhibits chemical decomposition reaction, by applying energy, effects different from phase changes of the material such as between gas and liquid and between gas and solid and physical reactions such as adsorption and dissociation of the gas molecules to a solid surface can be obtained. That is, it is possible to make the pressure inside the space higher than initial pressure or increase the pressure inside the space to pressure which breaks thermally-equilibrated state of gas molecules inside the space. Herein, the generated gas molecules are preferable to be inert gas which does not physically and chemically react with material in the periphery.

An example of using tertiary-butoxycarbonyl-oxy (tBOC) carrier which is, for example, a monomer material of a heat developing resist as the gas-generating material of the present invention will be described. When gradually heating this material from the room temperature, a thermal decomposition reaction at a first stage is generated at temperature T1 as illustrated in FIG. 3. An equation is, as illustrated in FIG. 4, a reaction of decomposing the tBOC carrier into a resin, carbon dioxide, and low-molecular weight alkene. The thermal decomposition reaction generated at T1 is an irreversible decomposition reaction and decomposition reactions are generated in almost all constituent molecules when the temperature exceeds T1. While the temperature T1 is adjustable by a modification of the tBOC carrier, it is about 150 to 300° C. When the material is heated over T1, a second stage thermal decomposition reaction is generated at temperature T2 as illustrated in FIG. 3. This is a thermal decomposition reaction of the resin which is a reaction product of the thermally decomposed tBOC carrier, and, while the temperature T2 is adjustable by a modification of the tBOC carrier, the temperature T2 is about 400° C. or higher. Thus, in the hybrid inertial sensor including the angular rate sensor and the acceleration sensor, when the tBOC carrier is provided as the gas-generating material only inside the space in which the acceleration sensor is placed and the whole of the sensor is heated at temperature higher than or equal to T1 and lower than or equal to T2 after sealing in an air-tight manner, it is possible to produce carbon dioxide only inside the space in which the acceleration sensor is placed. Since the number of molecules of carbon dioxide produced after reaction is proportional to the molar quantity of the chemical equation illustrated in FIG. 4, it is possible to adjust pressure in the space in which the acceleration sensor is placed after heating by adjusting the amount of providing the gas-generating material.

(Manufacturing Method) Next, a method of manufacturing the hybrid inertial sensor to which the present invention is applied will be described with reference to FIGS. 12A to 13C.

Figure 12A:
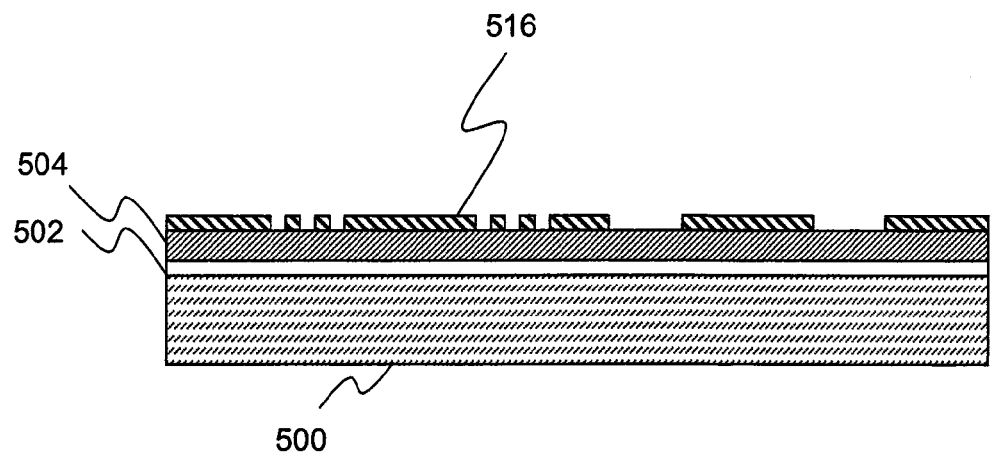
FIGS. 12A-12C are manufacturing process flow diagrams of the hybrid inertial sensor including an inner-pressure-adjusting gas-generating material to which the present invention is applied.
Figure 12B:
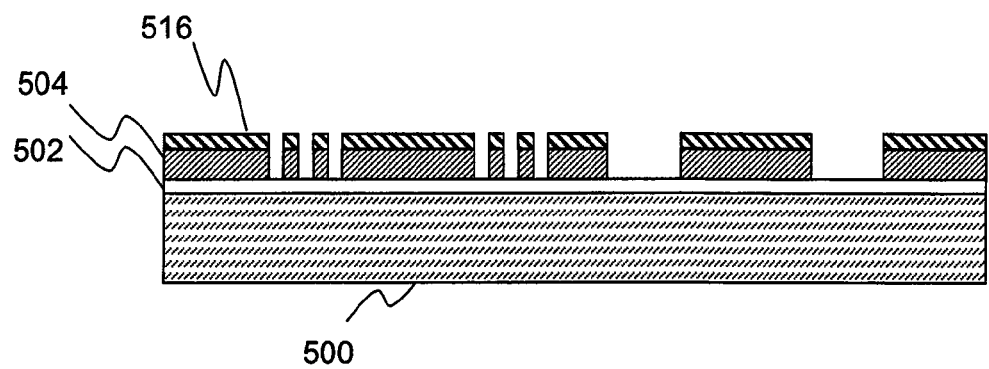
Figure 12C:
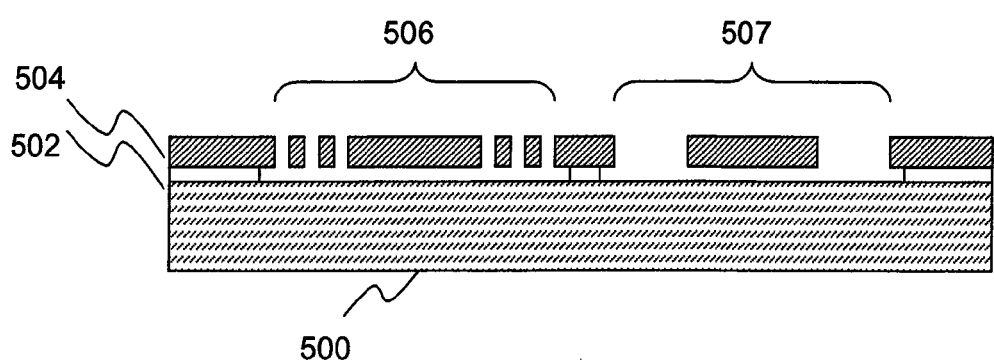
Figure 13A:
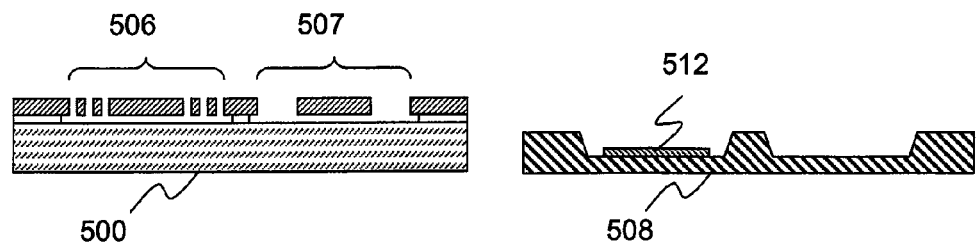
FIGS. 13A-13C are manufacturing process flow diagrams of the hybrid inertial sensor including the inner-pressure-adjusting gas-generating material to which the present invention is applied.

(Substrate and Cap Processing) First, a photo resist 516 is applied to the SOI active layer 504 on the SOI substrate including: the substrate 500; the BOX oxide 502; and the SOI active layer 504, and an inertial body structure of the sensor is transferred by photolithography technology (FIG. 12A). Next, on the SOI substrate including the substrate 500, the BOX oxide 502, and the SOI active layer 504, an inertial body structure of the sensor is formed by deep etching technology of single crystal silicon (FIG. 12B), and the BOX oxide 502 at a lower portion of the structure is removed by etching, thereby obtaining the substrate 500 to which the x-axis acceleration sensor 506 and the y-axis acceleration sensor 507, which are movable structures of the two acceleration sensors, are formed (FIG. 12C). On the other hand, to the cap member 508 formed of glass, single crystal silicon, or a resin, the spaces for placing the two acceleration sensors are formed by using a chemical or physical etching method. After the spaces for placing the acceleration sensors are formed, the gas-generating material 512 is attached to a place corresponding to the space for providing the acceleration sensor of the cap member 508 by a falling-drop method (instillation method) or spin coating (FIG. 13A).

(Amount of Providing Material) Herein, the amount of attaching the gas-generating material 512 is determined in the following manner. When an area each of the acceleration sensors occupies on the chip is 1.0 mm×1.0 mm, a spatial depth of the cap member 508 is 100 μm, and a thickness of the BOX oxide 502 a forming space at a lower portion of the sensor is 2.0 μm, a volume V of the space in which the acceleration sensor is placed is about $1.0 \times 10^{-10}$ m$^3$. Sealing is performed so that pressure of the space in which the x-axis acceleration sensor is placed is 5000 Pa at temperature 300K (near the room temperature), and thus initial pressure $P_0$ of the space in which the y-axis acceleration sensor is placed is 5000 Pa at temperature 300K (near the room temperature) before a heating pressure adjustment of the gas-generating material. Thus, a molecular weight $n_0$ of gas previously existing in the space in which the y-axis acceleration sensor is placed can be expressed as, with using the gas constant R ($=8.31 \times 10^3$ Pa·m/K/mol) and according to the equation of state of ideal gas, $$n_0 = P_0 V/(RT) = 2.0 \times 10^{-13} \text{[mol]} \tag{1}$$

Further, when target pressure $P_1$ of the space in which the y-axis acceleration sensor is placed is $3.0 \times 10^5$ Pa (3 atm), a required molar quantity $\Delta n$ of the generated gas can be calculated from equations (2) and (3) according to the Charles's law of ideal gas and expressed as $$n_0/P_0 = (n_0 + \Delta n)/P_1 \tag{2}$$

$$\Delta n = (P_1/P_0 - 1) n_0 = (P_1/P_0 - 1)(P_0 V/(RT)) = 1.2 \times 10^{-11} \text{[mol]} \tag{3}$$

Since the thermal decomposition reaction of the tBOC carrier follows the reaction equation illustrated in FIG. 4 in a stoicheiometric view, it can be interpreted that 1 mol of carbon dioxide is generated with respect to 1 mol of the tBOC carrier having a macromolecular chain of n=1. That is, the molar quantity of the tBOC carrier which is the gas-generating material is equal to the molar quantity $\Delta n$ of the generated carbon dioxide.

Note that the pressure P1 of the space in which the y-axis acceleration sensor is placed is preferable to be lower than or equal to 5.1 atm.

(Required Molar Quantity of tBOC Carrier) The gas-generating material containing the tBOC carrier of $\Delta n = 1.2 \times 10^{-11}$ [mol] required to make the target pressure $P_1$ at $3.0 \times 10^5$ Pa (3 atm) is obtained in the following manner. As a solvent of butyl acetate having a specific gravity of 0.88, a solution of the tBOC carrier having a molar concentration of 1% is made. When the butyl acetate solution of the tBOC carrier having a molar concentration of 1% is provided to a region in which the y-axis acceleration sensor is placed (area: 1 mm×1 mm) of the cap member having a thickness of 300 nm, a mole number of the tBOC carrier contained in the solution is $1.2 \times 10^{-11}$ [mol], and a molar quantity of carbon dioxide obtained by subjecting the solution to a heating decomposition is $1.2 \times 10^{-11}$ [mol]. Note that, when using a solution of the tBOC carrier with using butyl acetate as a solvent, it is possible to stably attach the tBOC carrier to the cap member, the tBOC carrier becoming a film membrane state when a prebaking is performed at a boiling point of the butyl acetate (126° C.) or more after applying the solution to the cap member by a falling-drop method or spin coating.

Figure 13B:
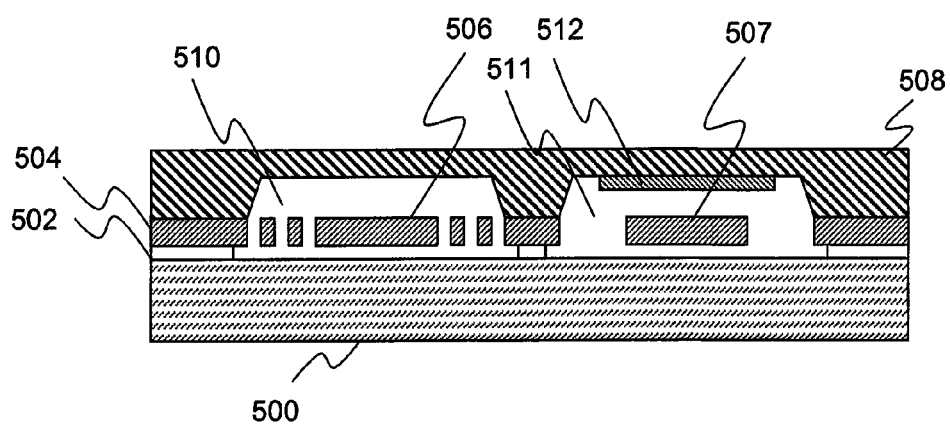
Figure 13C:
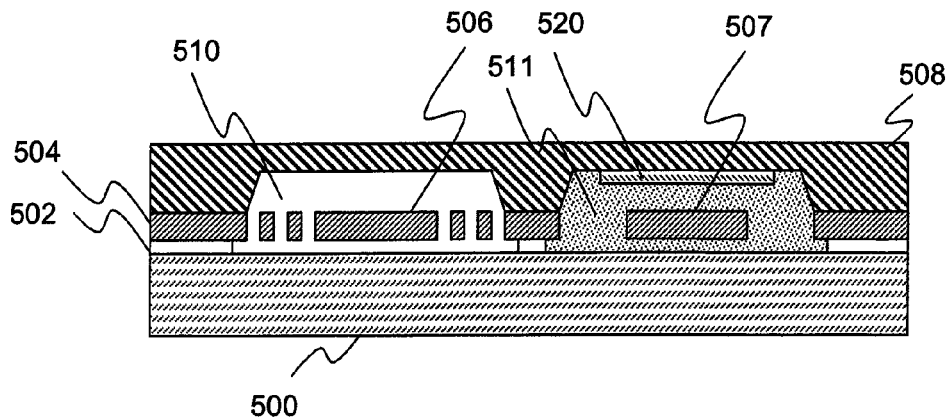

(Bonding and Back Surface Wiring) Next, the substrate 500, to which the movable structures of the x-axis acceleration sensor 506 and the y-axis acceleration sensor 507 are formed, and the cap member 508, in which the gas-generating material is attached to the space in which the y-axis acceleration sensor is placed, are bonded at pressure lower than or equal to 5000 Pa at which detection accuracy of the x-axis acceleration sensor can be sufficiently obtained. Both of the space in which the x-axis acceleration sensor is placed and the space in which the y-axis acceleration sensor is placed are sealed in an air-tight manner not to cause pressure changes upon performing an exchange of gas molecules through the outside of the sensor chip. A method of bonding is a method of using an adhesive when the cap member is a resin, or an anode bonding method when the cap member is single crystal silicon or glass. Predicting degassed components from an interface of the materials upon bonding, the sealing is performed at pressure lower than the target pressure. Right after the bonding sealing, pressures of the space 510 in which the x-axis acceleration sensor is placed and the space 511 in which the y-axis acceleration sensor is placed are the same (FIG. 13B).

(Pressure Adjusting Procedure) After bonding the cap member and the substrate, the whole of the sensor is heated. Heating temperature in this step may be higher or equal to temperature causing the gas-generating material 512 to exhibit the first stage thermal decomposition reaction and lower than or equal to temperature causing the second stage thermal decomposition reaction. More specifically, when the gas-generating material is the tBOC carrier which is a monomer material of a thermal development type resist, the thermal decomposition reaction temperature T1 of the first stage is about 150° C. to 250° C., and the thermal decomposition reaction temperature T2 of the second stage is about 400° C. or more, and thus the temperature to heat the whole of the sensor may be set to 150° C. to 400° C. After the thermal decomposition reaction of the gas-generating material, residual substance 520 and carbon oxide molecule exist (FIG. 7C) in the space 511 in which the y-axis acceleration sensor is placed. Boiling point of carbon oxide is −78.5° C./1 atm, and thus, the pressure of the space 511 in which the y-axis acceleration sensor is placed can be higher just by partial pressure of molecules of the generated carbon oxide at temperature higher than −78.5° C. Since the gas-generating material does not exist in the space in which the x-axis acceleration sensor is placed, there is nothing other than degassing reaction from a material surface of a wall of the space in which the x-axis acceleration sensor is placed. That is, the pressure of the space in which the x-axis acceleration sensor is placed is rarely fluctuated by heating the whole of the sensor. That is, the pressure of the space in which the x-axis acceleration sensor is placed is rarely fluctuated by heating the whole of the sensor.

In this manner, by adding the step of heating after the air-tight sealing step of the sensor, the inside of the space 511 in which the y-axis acceleration sensor is placed and the gas-generating material is provided can be sealed in an air tight manner at pressure higher than that of the space 510 in which the x-axis acceleration sensor is placed. In this case, the hybrid inertial sensor can be sealed as a configuration having no air holes for injecting a damping agent, and thus an acceleration sensor or a hybrid inertial sensor ensuring a long-term stability of a mechanical strength and sensor performance and is difficult to be affected by vibration noise can be obtained.

Note that the difficulties of being affected by vibration noise of the x-axis acceleration sensor put under pressure of 5000 Pa and the y-axis acceleration sensor put at $3.0 \times 10^5$ Pa (3 atm) can be calculated in the following manner using the method described in the first embodiment.

Figure 14:
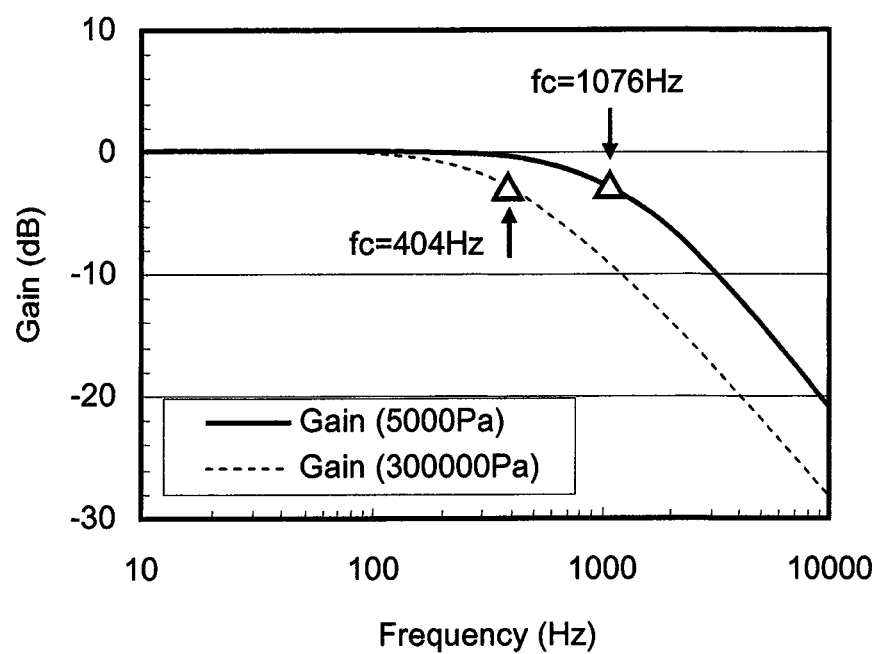
FIG. 14 is a graph illustrating frequency characteristics of an acceleration sensor put under pressure at 5000 Pa and an acceleration sensor put under pressure at $3.0 \times 10^5$ Pa.

When a character frequencies f0 of the x-axis acceleration sensor and the y-axis acceleration sensor are both 4000 Hz and damping constants at $3.0 \times 10^5$ Pa (3 atm) is 50, frequency characteristics of the x-axis acceleration sensor put under 5000 Pa and the y-axis acceleration sensor put under $3.0 \times 10^5$ Pa (3 atm) can be illustrated as in FIG. 14, and cutoff frequencies fc and Q values are as in Table 2.

TABLE 2

Characteristics Comparison of Acceleration Sensors

| | | |
|---|---|---|
| Pressure P of Space | $3.0 \times 10^5$ Pa | 5000 Pa |
| Character Frequency f0 | 4000 Hz | |
| Cutoff Frequency fc | 404 Hz | 1076 Hz |
| Q Value | 0.01 | 0.06 |

According to Table 2, the y-axis acceleration sensor provided at $3.0 \times 10^5$ Pa (3 atm) is a mechanical filter having a cutoff frequency fc of 404 Hz. Thus, as compared with the x-axis acceleration sensor provided at 5000 Pa having a mechanical cutoff frequency of 1076 Hz, filtering properties being difficult to be affected by high-frequency vibrational noise is obtained. While a method of removing signals in a frequency band higher than a frequency to be measured by an electrical signal processing is thinkable, there is a possibility of erroneous output by the sensor if the sensor inertial body is operated in a range exceeding a mechanically allowable range, and thus the sensor inertial body is essentially preferable to be difficult to receive operational affection by vibrational noise.

For example, when the acceleration sensors described in this embodiment is mounted on a vehicle, by making the x-axis acceleration sensor measure inclination (frequency band is narrow and DC measurement is sufficient) and the y-axis acceleration sensor detect movements (frequency band is wide) in the sensor, in environment having large vibrational noise, the sensor can be highly accurate with satisfying measurement requirements by changing pressure, i.e., increasing the pressure in the x-axis acceleration sensor.

INDUSTRIAL APPLICABILITY

The present invention can be widely used for inertial sensors including an angular rate sensor and/or an acceleration sensor.

The invention claimed is:
1. An inertial sensor comprising:
a substrate;
a movable portion formed on the substrate; and
a cap member which seals the movable portion so as to cover the movable portion, wherein a gas-generating material is applied to a movable portion side of the cap member,
wherein a pressure of a space covering the movable portion and including the gas-generating material provided therein is higher than that in a case of not providing the gas-generating material.
2. The inertial sensor according to claim 1, wherein,
by heating the gas-generating material, the space in which the movable portion can be moved has a pressure higher than the air pressure.
3. The inertial sensor according to claim 2, wherein the pressure inside the space is lower than or equal to 5.1 atm.
4. The inertial sensor according to claim 1, wherein the gas-generating material is a tertiary-butoxycarbonyloxy carrier.
5. An inertial sensor in which an angular rate sensor and an acceleration sensor are integrated, wherein
a movable portion of the angular rate sensor and a movable portion of the acceleration sensor are formed on a same substrate,
a cap member which seals each of the two movable portions so as to cover each of the two movable portions is formed,
a gas-generating material is applied only to a portion of the cap member corresponding to the acceleration sensor, and
a pressure of a first space covering the movable portion of the acceleration sensor is higher than a pressure of a second space covering the movable portion of the angular rate sensor.
6. The inertial sensor according to claim 5, wherein,
by heating the gas-generating material, a pressure of the first space in which the movable portion of the acceleration sensor can be moved is higher than that of the second space in which the movable portion of the angular rate sensor can be moved.

7. The inertial sensor according to claim 6, wherein the pressure of the first space is higher than or equal to the air pressure and lower than or equal to 5.1 atm.

8. The inertial sensor according to claim 5, wherein the gas-generating material is a tertiary-butoxycarbonyloxy carrier.

9. A method of manufacturing an inertial sensor comprising the steps of:
forming a movable portion on a substrate;
forming a concave portion to a cap that covers the movable portion;
applying a gas-generating material on the substrate;
bonding the cap onto the substrate; and
heating the gas-generating material,
wherein a pressure of a space covering the movable portion and including the gas-generating material provided therein is higher than that in a case of not providing the gas-generating material.

10. A method of manufacturing an inertial sensor comprising the steps of:
forming a first movable portion which measures an angular rate and a second movable portion which measures acceleration on a substrate;
forming concave portions corresponding to the first movable portion and the second movable portion to a cap, the cap covering the first movable portion and the second movable portion;
applying a gas-generating material to the second movable portion;
bonding the cap onto the substrate; and
heating the gas-generating material,
a pressure of a first space covering the second movable portion is higher than a pressure of a second space covering the first movable portion.

11. An inertial sensor in which two acceleration sensors being perpendicular to each other are integrated, wherein
each of a plurality of movable portions of the two acceleration sensors is formed on a same substrate;
a cap member which seals each of the movable portions of the two acceleration sensors so as to cover each of the two movable portions is formed;
a gas-generating material is applied only to a portion of the cap member corresponding to one of the two acceleration sensors; and
a pressure of a first space covering a first movable portion of one of the two acceleration sensors is higher than a pressure of a second space covering a second movable portion of the other one of the two acceleration sensors.

12. The inertial sensor according to claim 11, wherein, by heating the gas-generating material, a pressure of the first space in which the first movable portion of the two acceleration sensors is movable is higher than a pressure of the second space in which the second movable portion of the two acceleration sensors is movable.

13. The inertial sensor according to claim 12, wherein the pressure of the first space is higher than or equal to the air pressure and lower than or equal to 5.1 atm.

14. The inertial sensor according to claim 11, wherein the gas-generating material is a tertiary-butoxycarbonyloxy carrier.

\* \* \* \* \*